United States Patent
La Malfa et al.

(10) Patent No.: US 6,922,362 B2
(45) Date of Patent: Jul. 26, 2005

(54) STRUCTURE FOR UPDATING A BLOCK OF MEMORY CELLS IN A FLASH MEMORY DEVICE WITH ERASE AND PROGRAM OPERATION REDUCTION

(75) Inventors: Antonino La Malfa, Catania (IT); Salvatore Poli, Mascalucia (IT); Paolino Schillaci, Casteltermini (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 80 days.

(21) Appl. No.: 10/686,552

(22) Filed: Oct. 15, 2003

(65) Prior Publication Data

US 2004/0141379 A1 Jul. 22, 2004

(30) Foreign Application Priority Data

Oct. 16, 2002 (IT) ..................................... MI2002A2192

(51) Int. Cl.[7] ............................................. G11C 16/00
(52) U.S. Cl. .......................... 365/185.28; 365/185.29; 365/189.07
(58) Field of Search ....................... 365/185.28, 185.29, 365/185.22, 189.07

(56) References Cited

U.S. PATENT DOCUMENTS

| 4,763,305 A | * | 8/1988 | Kuo ....................... 365/185.22 |
| 5,754,567 A | * | 5/1998 | Norman ....................... 714/773 |
| 6,157,570 A | * | 12/2000 | Nachumovsky ........ 365/185.18 |

* cited by examiner

Primary Examiner—Tan T. Nguyen
(74) Attorney, Agent, or Firm—Lisa K. Jorgenson; Jon A. Gibbons; Fleit, Kain, Gibbons, Gutman, Bongini & Bianco P.L.

(57) ABSTRACT

An electronic circuit structure for updating a block of memory cells in a flash memory device, the memory cells storing a current value, wherein the structure includes a data latch for receiving a new value to be written on the memory cells, a controller for erasing the block of memory cells simultaneously, and programming load bank coupled to the controller and the data latch for programming the memory cells individually; the structure further includes control logic coupled to the controller for enabling the controller and for enabling the programming load bank according to a comparison between the new value and the current value.

22 Claims, 3 Drawing Sheets

STRUCTURE FOR UPDATING A BLOCK OF MEMORY CELLS IN A FLASH MEMORY DEVICE WITH ERASE AND PROGRAM OPERATION REDUCTION

CROSS-REFERENCE TO RELATED APPLICATIONS

This application is based upon and claims priority from prior Italian Patent Application No. MI2002A002192, filed on Oct. 16, 2002 the entire disclosure of which is herein incorporated by reference.

FIELD OF THE INVENTION

The present invention generally relates to flash memory devices and more particularly to a structure and method for updating a block of memory cells in a flash memory device.

BACKGROUND OF THE INVENTION

A flash memory device is a particular type of $E^2PROM$ (Electrically Erasable and Programmable Read-Only Memory), which is used to store information that must be preserved even when a power supply is off; the flash memory is erased in blocks instead of one bit at a time. This results in a very simple structure of the flash memory, which can be manufactured at low cost and with high density. As a consequence, the flash memory is well suited to a number of end-product applications, such as Personal Computers (PCs), cellular phones, automotive devices, digital still cameras, and the like.

The flash memory includes a matrix of memory cells; typically, the matrix is partitioned into several sectors, which may be erased individually. An additional miniature matrix is often used to store configuration information in a permanent way. For example, the miniature matrix implements a (non-volatile) protection register for the sectors of the matrix.

The configuration of the protection register identifies which sectors are locked. A reading operation may be performed on every sector; however, an erase operation or a program operation is only allowed on the unlocked sectors. This mechanism makes it possible to protect the matrix from an undesired erasing and/or programming of the memory cells, thereby preventing any loss of data stored in the flash memory.

The configuration of the protection register is updated overriding its content with a new value. This operation involves the erasure of the whole protection register; the memory cells required to reach the new value are then programmed.

A drawback of the solution described above is that every updating of the protection register necessitates both an erase operation and a program operation. As a consequence, the update operation is (relatively) slow. During this operation all the functional units of the flash memory are busy, so that no other operation can be performed on the matrix.

Moreover, the memory cells of the protection register are subjected to an electrical stress during each erase and program operation; after repeated cycles of updating, this may cause loss of data stored in the protection register.

Accordingly what is needed is a structure to overcome the problems encountered in the prior art for updating a block of memory cells in a flash memory device.

SUMMARY OF THE INVENTION

The present invention overcomes the above-mentioned drawbacks by providing a structure for updating a block of memory cells in a flash memory device, the memory cells storing a current value, wherein the structure includes means for receiving a new value to be written on the memory cells, erasing means for erasing the block of memory cells simultaneously, and programming means for programming the memory cells individually; the structure further includes control means for enabling the erasing means and for enabling the programming means according to a comparison between the new value and the current value.

Moreover, the present invention provides a flash memory device including this structure. A corresponding method of updating a block of memory cells in a flash memory device is also encompassed.

BRIEF DESCRIPTION OF THE DRAWING

The subject matter, which is regarded as the invention, is particularly pointed out and distinctly claimed in the claims at the conclusion of the specification. The foregoing and other features, and advantages of the invention will be made clear by the following description of a preferred embodiment thereof, given purely by way of a non-restrictive indication, with reference to the attached figures, in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
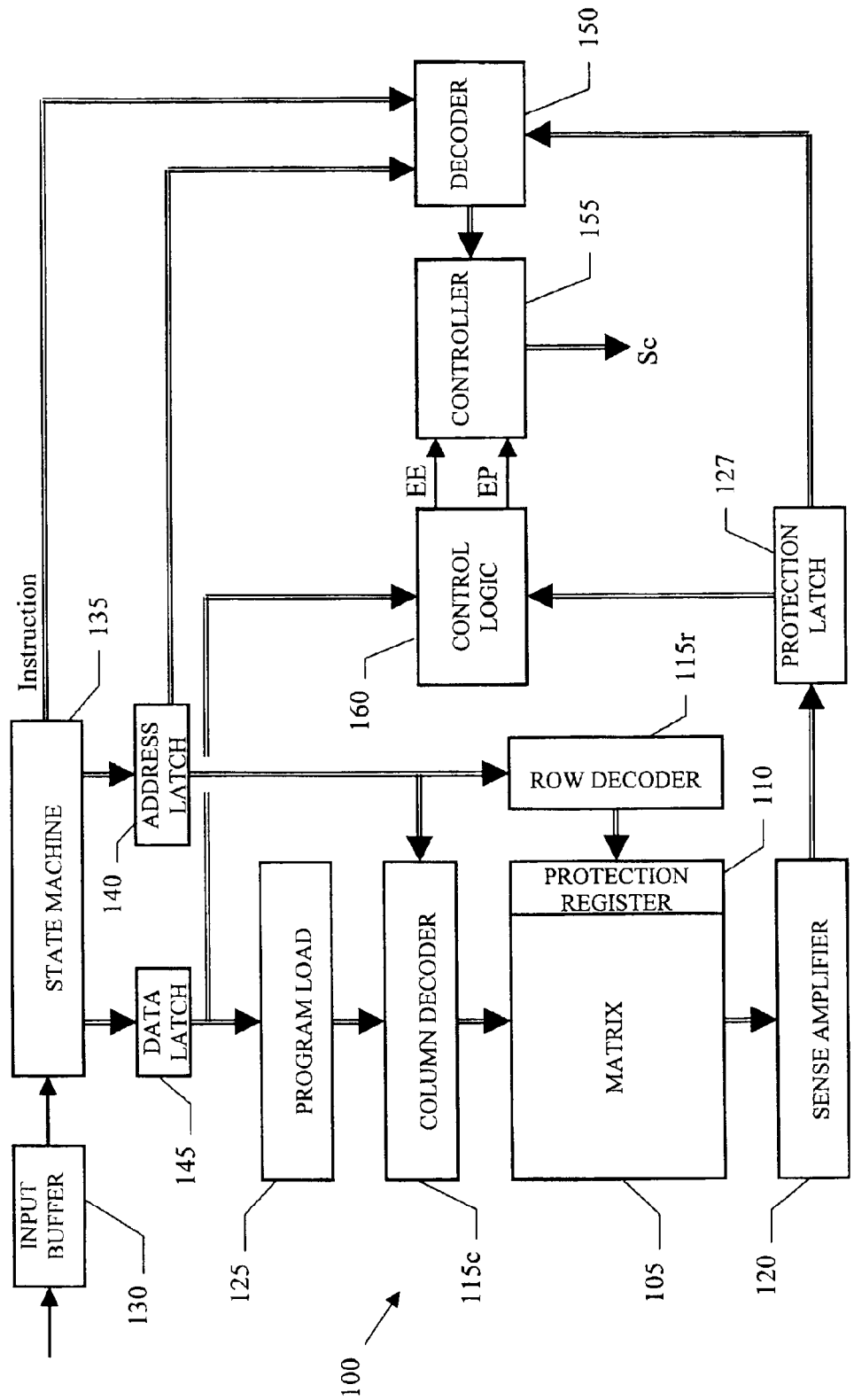
FIG. 1 is a schematic block diagram of a flash memory in which the structure of the invention can be used.

With reference in particular to FIG. 1, a writing section of a flash memory device 100 is illustrated. The flash memory 100 is integrated in a chip of semiconductor material. A matrix 105 of memory cells (for example, with a so-called NOR architecture) is used to store program code or data. The matrix 105 is segmented into a plurality of sectors (for example, 16 sectors from 0 to 15) made in respective insulated wells of the chip.

Each memory cell consists of a floating gate MOS transistor. The memory cell in a non-programmed (or erased) condition features a low threshold voltage (associated with a logic value 1). The memory cell is programmed by injecting electric charge into its floating gate; in this condition, the memory cell features a high threshold voltage (associated with a logic value 0). Conversely, the memory cell is erased by removing the electric charge accumulated in its floating gate; all the memory cells of a sector must be erased at the same time.

A miniature matrix 110 (close to the matrix 105) is used as a non-volatile protection register for the sectors of the matrix 100. The configuration of the protection register 110 identifies which sectors are locked, so that a program operation or an erase operation cannot be performed. For example, the protection register 110 consists of 3 memory cells (each one storing a bit); the $2^3=8$ combinations of the bits stored in the memory cells define the following protection conditions:

| Protection register | | | Locked sectors |
|---|---|---|---|
| 0 | 0 | 0 | None |
| 0 | 0 | 1 | Sector 15 |
| 0 | 1 | 0 | Sectors 14–15 |
| 0 | 1 | 1 | Sectors 12–15 |
| 1 | 0 | 0 | Sectors 8–16 |
| 1 | 0 | 1 | All (Sectors 0–15) |
| 1 | 1 | 0 | All (Sectors 0–15) |
| 1 | 1 | 1 | All (Sectors 0–15) |

The information stored in the protection register 110 is updated erasing and/or programming its memory cells; all the memory cells of the protection register 110 must be erased at the same time.

A column decoder 115c and a row decoder 115r select the memory cells of either the matrix 105 or the protection register 110. A bank of sense amplifiers 120 is used to read the values stored in the selected memory cells; a bank of program loads 125 is instead used to program the selected memory cells. The sense amplifiers 120 also interface with a volatile register (or latch) 127, which operates as a buffer for the protection information read from the register 110 (at the power-on of the flash memory 100).

The flash memory 100 has a serial interface for an external bus conforming to the SPI specification. Particularly, an input buffer 130 latches information received from the external bus. The input information is then provided to a state machine 135, which substantially operates as a series-to-parallel converter. The input information consists of instructions, addresses of memory cells, or data to be written onto selected memory cells.

Any address received from the external bus is stored in a latch 140, and it is then used to drive the column decoder 115c and the row decoder 115r. Likewise, any data is stored in a further latch 145. The data stored in the latch 145 is used to select the program loads 125 to be actuated (for the memory cells that need to be programmed).

Any instruction is instead provided to a decoder 150, which also receives the address stored in the latch 140 and the protection information stored in the latch 127. The decoder 150 interprets the instruction; moreover, it verifies whether the instruction involves an erase operation or a program operation on memory cells of a locked sector. Any instruction attempting to erase or to program a locked sector is aborted; otherwise, the decoder 150 actuates a controller 155 accordingly. The controller 155 generates a sequence of control signals (denoted as a whole with Sc), which cause execution of the operations required by the instruction.

A specific instruction is used to update the content of the protection register 110. A new value to be written on the protection register 110 (stored in the latch 145) and its current value (stored in the latch 127) are provided to a control logic 160. As described in detail in the following, the control logic 160 outputs an erase-enabling signal EE and a program-enabling signal EP for the controller 155. The signal EE is asserted when the updating of the protection register 110 requires an erase operation; the signal EP is instead asserted when the updating of the protection register 110 requires a program operation.

In the flash memories known in the art, any updating of the protection register 110 involves the overriding of its content with the new value. As a consequence, the whole protection register 110 is at first erased; the memory cells required to reach the new value are then programmed.

However, this procedure is not optimal. In fact, the erase operation and the program operation are not always required to reach the new value from the current value. The operations actually necessary for every combination current value/new value (64 cases) are shown in the following table:

| Current value | | | New value | | | Erase | Program |
|---|---|---|---|---|---|---|---|
| 0 | 0 | 0 | 0 | 0 | 0 | No | No |
| 0 | 0 | 0 | 0 | 0 | 1 | Yes | Yes |
| 0 | 0 | 0 | 0 | 1 | 0 | Yes | Yes |
| 0 | 0 | 0 | 0 | 1 | 1 | Yes | Yes |
| 0 | 0 | 0 | 1 | 0 | 0 | Yes | Yes |
| 0 | 0 | 0 | 1 | 0 | 1 | Yes | Yes |
| 0 | 0 | 0 | 1 | 1 | 0 | Yes | Yes |
| 0 | 0 | 0 | 1 | 1 | 1 | Yes | No |
| 0 | 0 | 1 | 0 | 0 | 0 | No | Yes |
| 0 | 0 | 1 | 0 | 0 | 1 | No | No |
| 0 | 0 | 1 | 0 | 1 | 0 | Yes | Yes |
| 0 | 0 | 1 | 0 | 1 | 1 | Yes | Yes |
| 0 | 0 | 1 | 1 | 0 | 0 | Yes | Yes |
| 0 | 0 | 1 | 1 | 0 | 1 | Yes | Yes |
| 0 | 0 | 1 | 1 | 1 | 0 | Yes | Yes |
| 0 | 0 | 1 | 1 | 1 | 1 | Yes | No |
| 0 | 1 | 0 | 0 | 0 | 0 | No | Yes |
| 0 | 1 | 0 | 0 | 0 | 1 | Yes | Yes |
| 0 | 1 | 0 | 0 | 1 | 0 | No | No |
| 0 | 1 | 0 | 0 | 1 | 1 | Yes | Yes |
| 0 | 1 | 0 | 1 | 0 | 0 | Yes | Yes |
| 0 | 1 | 0 | 1 | 0 | 1 | Yes | Yes |
| 0 | 1 | 0 | 1 | 1 | 0 | Yes | Yes |
| 0 | 1 | 0 | 1 | 1 | 1 | Yes | No |
| 0 | 1 | 1 | 0 | 0 | 0 | No | Yes |
| 0 | 1 | 1 | 0 | 0 | 1 | No | Yes |
| 0 | 1 | 1 | 0 | 1 | 0 | No | Yes |
| 0 | 1 | 1 | 0 | 1 | 1 | No | No |
| 0 | 1 | 1 | 1 | 0 | 0 | Yes | Yes |
| 0 | 1 | 1 | 1 | 0 | 1 | Yes | Yes |
| 0 | 1 | 1 | 1 | 1 | 0 | Yes | Yes |
| 0 | 1 | 1 | 1 | 1 | 1 | Yes | No |
| 1 | 0 | 0 | 0 | 0 | 0 | No | Yes |
| 1 | 0 | 0 | 0 | 0 | 1 | Yes | Yes |
| 1 | 0 | 0 | 0 | 1 | 0 | Yes | Yes |
| 1 | 0 | 0 | 0 | 1 | 1 | Yes | Yes |
| 1 | 0 | 0 | 1 | 0 | 0 | No | No |
| 1 | 0 | 0 | 1 | 0 | 1 | Yes | Yes |
| 1 | 0 | 0 | 1 | 1 | 0 | Yes | Yes |
| 1 | 0 | 0 | 1 | 1 | 1 | Yes | No |
| 1 | 0 | 1 | 0 | 0 | 0 | No | Yes |
| 1 | 0 | 1 | 0 | 0 | 1 | No | Yes |
| 1 | 0 | 1 | 0 | 1 | 0 | Yes | Yes |
| 1 | 0 | 1 | 0 | 1 | 1 | Yes | Yes |
| 1 | 0 | 1 | 1 | 0 | 0 | No | Yes |
| 1 | 0 | 1 | 1 | 0 | 1 | No | No |
| 1 | 0 | 1 | 1 | 1 | 0 | Yes | Yes |
| 1 | 0 | 1 | 1 | 1 | 1 | Yes | No |
| 1 | 1 | 0 | 0 | 0 | 0 | No | Yes |
| 1 | 1 | 0 | 0 | 0 | 1 | Yes | Yes |
| 1 | 1 | 0 | 0 | 1 | 0 | No | Yes |
| 1 | 1 | 0 | 0 | 1 | 1 | Yes | Yes |
| 1 | 1 | 0 | 1 | 0 | 0 | No | Yes |
| 1 | 1 | 0 | 1 | 0 | 1 | Yes | Yes |
| 1 | 1 | 0 | 1 | 1 | 0 | No | No |
| 1 | 1 | 0 | 1 | 1 | 1 | Yes | No |
| 1 | 1 | 1 | 0 | 0 | 0 | No | Yes |
| 1 | 1 | 1 | 0 | 0 | 1 | No | Yes |
| 1 | 1 | 1 | 0 | 1 | 0 | No | Yes |
| 1 | 1 | 1 | 0 | 1 | 1 | No | Yes |
| 1 | 1 | 1 | 1 | 0 | 0 | No | Yes |
| 1 | 1 | 1 | 1 | 0 | 1 | No | Yes |
| 1 | 1 | 1 | 1 | 1 | 0 | No | Yes |
| 1 | 1 | 1 | 1 | 1 | 1 | No | No |

As can be seen, in 8 cases out of 64 (about 12%) no operation must be performed (since the new value is already stored in the protection register 110). Only the erase operation is required in 19 cases out of 64 (about 30%), and only the program operation is required in 7 cases out of 64 (about 11%). Both the erase operation and the program operation are required in the remaining 47 cases out of 64 (about 47%).

Therefore, assuming that the pairs current value/new value are uniformly distributed among the 64 possible combinations, it results that (on the average) an erase operation is performed even when it is not necessary in the 23% of the cases (12%+11%); likewise, a program operation is performed even when it is not necessary in the 42% of the cases (12%+30%).

In sharp contrast to the solutions known in the art, the structure described in the following compares the new value to be written on the protection register 110 with its current value; the protection register 110 is then erased and/or programmed only when it is necessary (according to the result of the comparison).

However, the concepts of the present invention are also applicable when the flash memory has another architecture, when the matrix is partitioned in a different way, or when the protection register has another structure; similar considerations apply if equivalent information is stored in the protection register, if the flash memory has a different interface (even of the parallel type), and the like.

Alternatively, the proposed structure is used to update other non-volatile registers of the flash memory (for example, storing configuration information). Moreover, the same structure finds application in a so-called page flash as well, wherein small blocks of memory cells (for example, storing 4–16 bits) may be erased individually; in this case, the proposed solution is used to update every block of memory cells of the matrix.

Figure 2A:
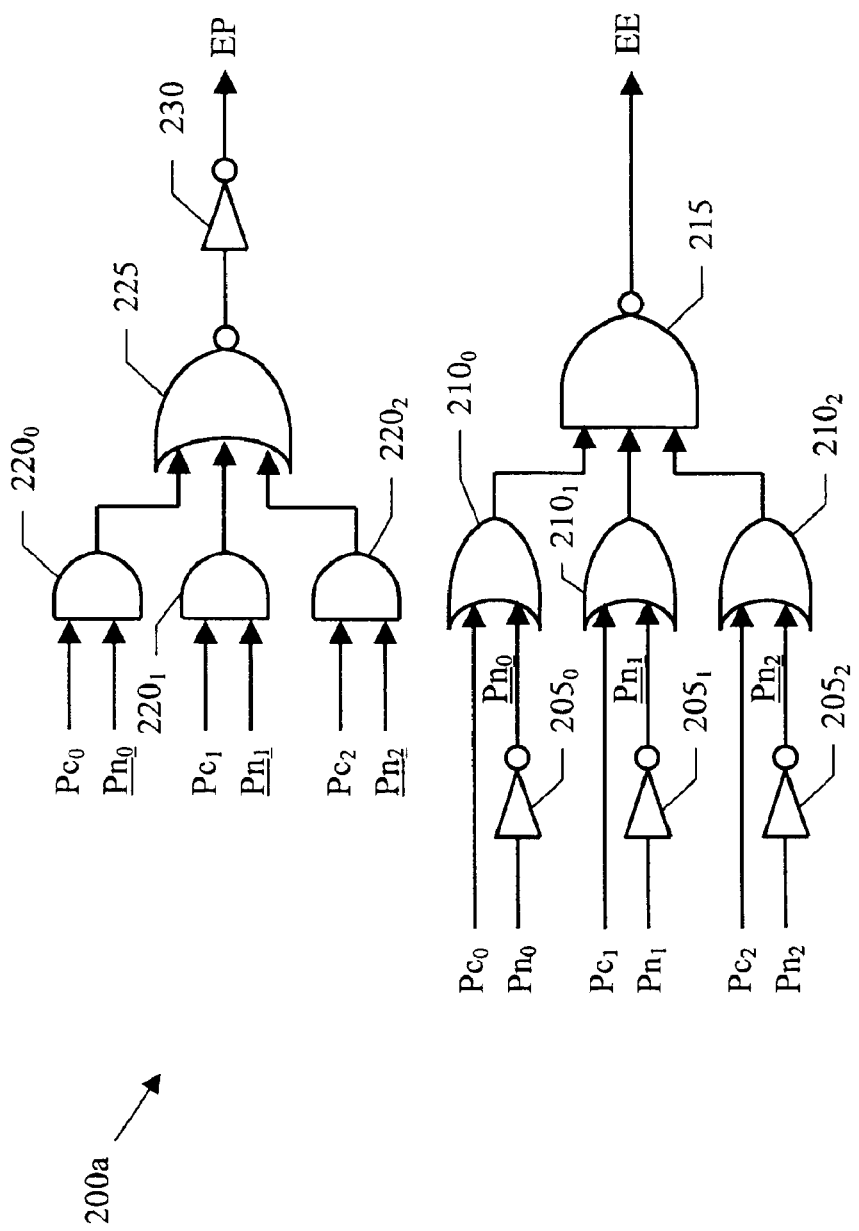
FIGS. 2a and 2b show different circuit schemes implementing the proposed structure.

In an embodiment of the present invention, as shown in FIG. 2a, the control logic is implemented with a combinatorial circuit 200a.

Particularly, each bit $Pn_i$ (with i=0 .. 2) of the new value to be written on the protection register is supplied to a NOT logic gate $205_i$, which outputs a corresponding inverted bit $\underline{Pn_i}$. An OR logic gate $210_i$ is provided for each bit; the OR gate $210_i$ is input the inverted bit $\underline{Pn_i}$ and a corresponding bit $Pc_i$ of the current value stored in the protection register. The output terminals of the OR gates $210_i$ are connected to respective input terminals of a NAND logic gate 215, which generates the erase-enabling signal EE.

Moreover, each inverted bit $\underline{Pn_i}$ and each bit $Pc_i$ are AND-ed by a corresponding logic gate $220_i$. The signals provided by the AND gates $220_i$ are applied to respective input terminals of a NOR logic gate 225. The output signal of the NOR gate 225 is inverted by a NOT logic gate 230, which generates the program-enabling signal EP.

Whenever the content of the protection register must be updated, its current value (stored in the protection latch) is compared with the desired new value (stored in the data latch). As a consequence, the erase-enabling signal EE is asserted when an erase operation is required to reach the new value from the current value. In detail, if a memory cell is programmed in the current value ($Pc_i$=0) and erased in the new value ($Pn_i$=1), the output signal of the corresponding OR gate $210_i$ is deasserted. When this condition is satisfied for one or more bits, the erase-enabling signal EE output by the NAND gate 215 is asserted. In response thereto, the controller erases all the memory cells of the protection register at the same time; the protection register is then read to verify the completion of the erase operation, and the content of the protection latch is updated accordingly ($Pc_2$=1, $Pc_1$=1 and $Pc_0$=1). Conversely, the erase-enabling signal EE remains deasserted, and no operation is performed on the protection register.

The up-to-date current value of the protection register (after the possible erase operation) is compared again with the desired new value. As a consequence, the program-enabling signal EP is asserted when a program operation is required to reach the new value from the (up-to-date) current value. In detail, if a memory cell is erased in the current value ($Pc_i$=1) and programmed in the new value ($Pn_i$=0), the output signal of the corresponding AND gate $220_i$ is asserted. When this condition is satisfied for one or more bits, the output signal of the NOR gate 225 is deasserted; therefore, the program erase-enabling signal EP output by the NOT gate 230 is asserted. In response thereto, the controller programs the cells of the protection register required to reach the new value; the protection register is then read to verify the completion of the program operation, and the content of the protection latch is updated accordingly. Conversely, the program-enabling signal EP remains deasserted, and no operation is performed on the protection register (since it already stores the desired new value).

Figure 2B:
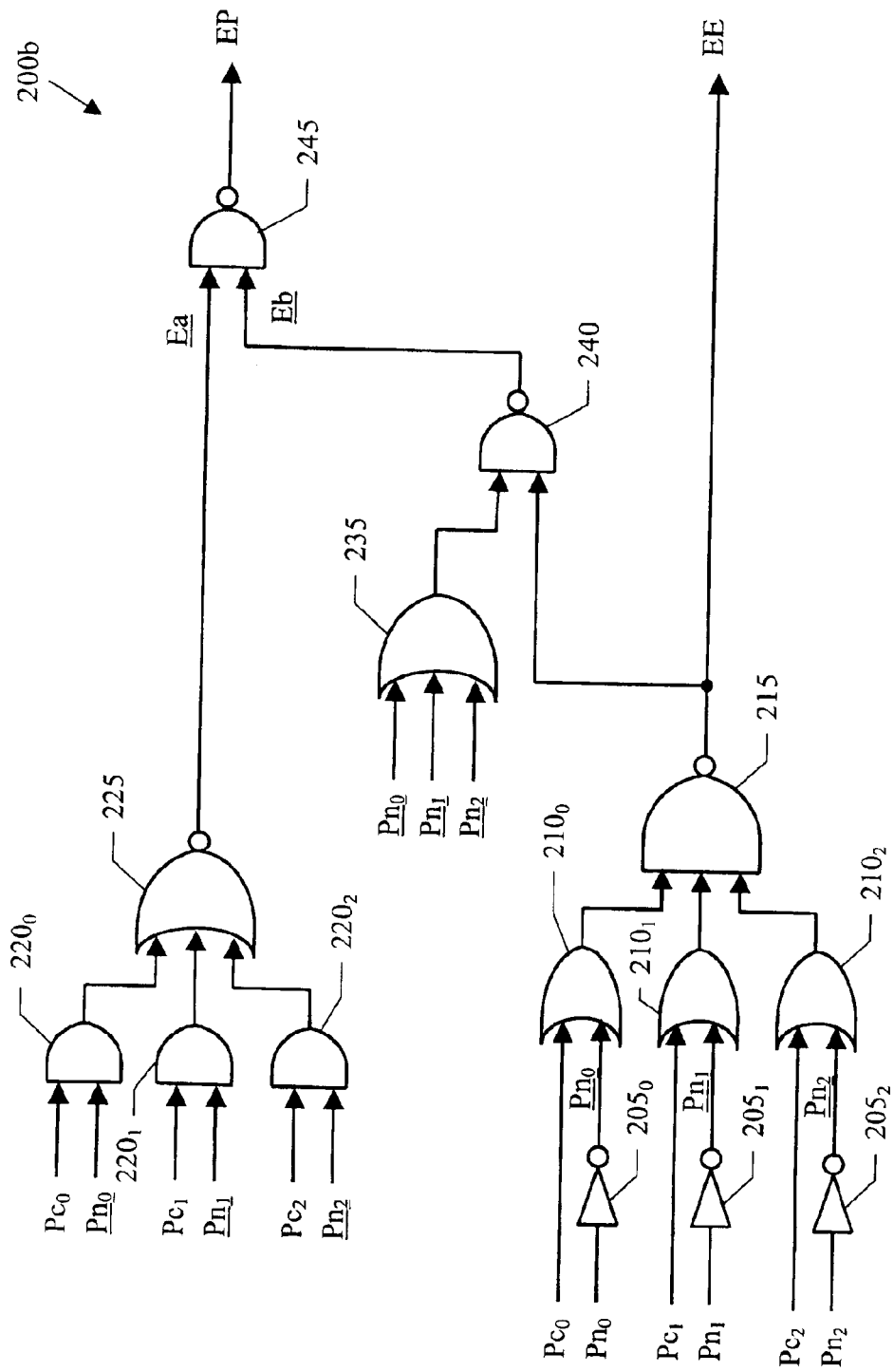

Considering now FIG. 2b, an alternative embodiment of the present invention is illustrated. In this case, the control logic is implemented with a different combinatorial circuit 200b (the elements corresponding to the ones shown in FIG. 2a are denoted with the same references, and their explanation is omitted for the sake of simplicity).

Particularly, the erase-enabling signal EE is generated by the logic gates $205_i,210_i,215$ as described above. The logic gates $205_i,220_i,225$ instead generate an internal signal denoted with $\underline{Ea}$ (the internal signal Ea is underlined to specify that it is deasserted at logic value 1 and asserted at logic value 0). All the inverted bits $\underline{Pn_0}$–$\underline{Pn_2}$ are further OR-ed by a logic gate 235. A NAND logic gate 240 is input the signal generated by the OR gate 235 and the erase-enabling signal EE (generated by the NAND gate 215); the NAND gate 240 outputs a further internal signal denoted with $\underline{Eb}$. The internal signal $\underline{Ea}$ (from the NOR gate 225) and the internal signal $\underline{Eb}$ (from the NAND gate 240) are provided to respective input terminals of a NAND logic gate 245; the NAND gate 245 generates the program-enabling signal EP.

Whenever the content of the protection register must be updated, its current value (stored in the protection latch) is compared with the desired new value (stored in the data latch). As described above, the erase-enabling signal EE is asserted when an erase operation is required to reach the new value from the current value. In response thereto, the controller erases all the memory cells of the protection register at the same time; however, the content of the protection latch is not updated. Conversely, the erase-enabling signal EE remains deasserted, and no operation is performed on the protection register.

The (original) current value of the protection register is compared again with the desired new value. As a consequence, the program-enabling signal EP is asserted when a program operation is required to reach the new value from the current value; at the same time, the program-enabling signal EP is also asserted when the protection register has been erased but one or more memory cells must be programmed in the new value.

In detail, if a memory cell is erased in the current value ($Pc_i$=1) and programmed in the new value ($Pn_i$=0), the output signal of the corresponding AND gate $220_i$ is asserted. When this condition is satisfied for one or more bits, the internal signal $\underline{Ea}$ output by the NOR gate 225 is asserted (0). Otherwise, the internal signal $\underline{Ea}$ remains deasserted (1). Moreover, if one or more of the memory cells are programmed in the new value (Pn$_i$=0), the output signal of the OR gate 235 is asserted. If at the same time the protection register has been erased (EE=1), the internal signal Eb output by the NAND gate 240 is asserted (0). Otherwise, the internal signal Eb remains deasserted (1). If the internal signal Ea or the internal signal Eb are asserted, the program-enabling signal EP is asserted. In response thereto, the cells of the protection register required to reach the new value are programmed, and the protection latch is updated accordingly. Conversely, the program-enabling signal EP remains deasserted, and no operation is performed on the protection register.

However, the concepts of the present invention are also applicable when the control logic is implemented with an equivalent combinatorial circuit, when the logic gates are interconnected in another way, when different logic gates are used, and the like.

More generally, the present invention proposes a structure for updating a block of memory cells (storing a current value) in a flash memory device. The structure includes means for receiving a new value to be written on the memory cells. Erasing means are provided for erasing the block of memory cells simultaneously; programming means are instead provided for programming the memory cells individually. The structure of the invention further includes control means for enabling the erasing means and for enabling the programming means according to a comparison between the new value and the current value.

In the proposed solution, the block of memory cells is erased and/or programmed only when it is necessary (according to the result of the comparison between the value currently stored and the new value to be written).

Therefore, in several cases the updating of the memory cells only involves an erase operation or a program operation. This strongly increases the speed of the whole update operation.

The structure of the invention avoids the involvement of the functional units required to erase and/or to program the memory cells when they are not necessary (thereby leaving the flash memory device available for other operations).

Moreover, the devised solution limits the electrical stress suffered by the memory cells during each update operation; in this way, the risk of loss of data is strongly reduced.

The preferred embodiment of the invention described above offers further advantages.

Particularly, the structure is implemented with a combinatorial circuit.

This solution is very simple, but at the same time effective.

As a further enhancement, the current value of the protection register is stored in a corresponding latch.

The proposed feature removes the need to perform any reading operation on the protection register for comparing its current value with the desired new value.

Typically, the block of memory cells consists of a protection register (even if different applications are not excluded).

Alternatively, equivalent control means is used (even of the sequential type), no latch is provided for the information stored in the protection register, or the proposed structure is used to update other blocks of memory cells.

In a particular embodiment of the invention, the control logic compares the new value of the protection register with its up-to-date current value (after a possible erase operation), in order to determine whether a program operation is required.

This solution simplifies the implementation of the control logic (even if the duration of the update operation is slightly increased).

In a different embodiment of the invention, the control logic always compares the new value of the protection register with its original current value.

This solution is faster, since no reading of the up-to-date current value of the protection register is required (even if the complexity of the control logic is slightly increased).

In both cases, a suggested choice for the implementation of the control logic consists of a set of logic gates.

The proposed structure is very simple and fast.

However, the solution according to the present invention leads itself to be put into practice with a different mechanism for comparing the value currently stored in the protection register with the new value to be written, or even implementing the control logic with another circuit.

Naturally, in order to satisfy local and specific requirements, a person skilled in the art may apply to the solution described above many modifications and alterations all of which, however, are included within the scope of protection of the invention as defined by the following claims.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. An electronic circuit for updating a block of memory cells, the electronic circuit comprising:

a block of memory cells;

a controller for simultaneously erasing a current value stored in the block of memory cells;

a data latch for receiving a new value to be written to at least one cell in the block of memory cells;

a program load bank coupled to the controller and the data latch for programming the cell in the block of memory cells individually; and control logic couple to the controller and the data latch, the control logic for selecting the cell in the block of memory cells for enabling the controller to erase the current value stored therein and for programming the new value therein;

whereby the control logic is governed by a result of a comparison between the new value to be written in the cell of the block of memory cells with the current value stored in the cell of the block of memory cells.

2. The electronic circuit according to claim 1, wherein the control logic further includes:

at least one combinatorial circuit, wherein the combinatorial circuit receives as inputs
   the current value stored in the cell and
   the new value to be written in the cell, and the combinatorial circuit provides as outputs
   an erase-enabling signal for governing the controller, and
   a program-enabling signal for governing the program load bank.

3. The electronic circuit according to claim 2, further comprising:
a latch for storing the current value read from the cell of the block of memory cells and wherein the latch provides the current value as input to the combinatorial circuit.

4. The electronic circuit according to claim 3, wherein the block of memory cells consists of a non-volatile register for storing protection information for a matrix of memory cells.

5. The electronic circuit according to any claim 6, wherein the control logic includes:
an erase-enabling means responsive to the current value and to the new value for enabling the controller, when an erase operation is required, to reach the new value from the current value; and
a program-enabling means responsive to the new value and to an up-top-date current value stored in the memory cells after the possible erase operation for enabling the programming load bank, when a program operation is required, to reach the new value from the up-to-date current value.

6. The electronic circuit according to any claim 5, wherein the erase-enabling means includes logic gates for asserting the erase-enabling signal when the cell has the current value programmed therein and the new value is equivalent to a value after the cell is erased; and
wherein the program-enabling means includes logic gates for asserting the program-enabling signal when the cell with an up-to-date current value is required to be erased and the new value programmed therein.

7. The electronic circuit, according to claim 4, wherein the control logic includes erase-enabling means responsive to the current value and to the new value for enabling the erasing controls when an erase operation is required to reach the new value from the current value, and
wherein the program-enabling means is responsive to the erase-enabling means, to the new value and to the current value for enabling the programming means when a program operation is required to reach the new value from the current value or when the erasing means has been enabled and the cell is programmed with the new value.

8. The electronic circuit, according to claim 7, wherein the erase-enabling means includes logic gates for asserting the erase-enabling signal when the cell is programmed with the current value and the new value in the is erased, and wherein the program-enabling means includes one or more logic gates for asserting the program-enabling signal when the current value in the cell is erased and the cell is programmed with the new value or when the erase-enabling signal is asserted and the cell is programmed with the new value.

9. The electronic circuit according to any claim 3, wherein the control logic includes:
an erase-enabling means responsive to the current value and to the new value for enabling the controller, when an erase operation is required, to reach the new value from the current value; and
a program-enabling means responsive to the new value and to an up-top-date current value stored in the memory cells after the possible erase operation for enabling the programming load bank, when a program operation is required, to reach the new value from the up-to-date current value.

10. The electronic circuit according to any claim 9, wherein the erase-enabling means includes logic gates for asserting the erase-enabling signal when the cell has the current value programmed therein and the new value is equivalent to a value after the cell is erased; and
wherein the program-enabling means includes logic gates for asserting the program-enabling signal when the cell with an up-to-date current value is required to be erased and the new value programmed therein.

11. The electronic circuit, according to claim 3, wherein the control logic includes erase-enabling means responsive to the current value and to the new value for enabling the erasing controls when an erase operation is required to reach the new value from the current value, and
wherein the program-enabling means is responsive to the erase-enabling means, to the new value and to the current value for enabling the programming means when a program operation is required to reach the new value from the current value or when the erasing means has been enabled and the cell is programmed with the new value.

12. The electronic circuit, according to claim 11, wherein the erase-enabling means includes logic gates for asserting the erase-enabling signal when the cell is programmed with the current value and the new value in the is erased, and wherein the program-enabling means includes one or more logic gates for asserting the program-enabling signal when the current value in the cell is erased and the cell is programmed with the new value or when the erase-enabling signal is asserted and the cell is programmed with the new value.

13. The electronic circuit according to claim 2, wherein the block of memory cells consists of a non-volatile register for storing protection information for a matrix of memory cells.

14. The electronic circuit according to any claim 2, wherein the control logic includes:
an erase-enabling means responsive to the current value and to the new value for enabling the controller, when an erase operation is required, to reach the new value from the current value; and
a program-enabling means responsive to the new value and to an up-top-date current value stored in the memory cells after the possible erase operation for enabling the programming load bank, when a program operation is required, to reach the new value from the up-to-date current value.

15. The electronic circuit according to any claim 14, wherein the erase-enabling means includes logic gates for asserting the erase-enabling signal when the cell has the current value programmed therein and the new value is equivalent to a value after the cell is erased; and
wherein the program-enabling means includes logic gates for asserting the program-enabling signal when the cell with an up-to-date current value is required to be erased and the new value programmed therein.

16. The electronic circuit, according to claim 2, wherein the control logic includes erase-enabling means responsive to the current value and to the new value for enabling the erasing controls when an erase operation is required to reach the new value from the current value, and
wherein the program-enabling means is responsive to the erase-enabling means, to the new value and to the current value for enabling the programming means when a program operation is required to reach the new value from the current value or when the erasing means has been enabled and the cell is programmed with the new value.

17. The electronic circuit, according to claim 16, wherein the erase-enabling means includes logic gates for asserting the erase-enabling signal when the cell is programmed with the current value and the new value in the is erased, and wherein the program-enabling means includes one or more logic gates for asserting the program-enabling signal when the current value in the cell is erased and the cell is programmed with the new value or when the erase-enabling signal is asserted and the cell is programmed with the new value.

18. The electronic circuit according to claim 1, wherein the block of memory cells consists of a non-volatile register for storing protection information for a matrix of memory cells.

19. The electronic circuit according to any claim 1, wherein the control logic includes:
    an erase-enabling means responsive to the current value and to the new value for enabling the controller, when an erase operation is required, to reach the new value from the current value; and
    a program-enabling means responsive to the new value and to an up-top-date current value stored in the memory cells after the possible erase operation for enabling the programming load bank, when a program operation is required, to reach the new value from the up-to-date current value.

20. The electronic circuit, according to claim 1, wherein the control logic includes erase-enabling means responsive to the current value and to the new value for enabling the erasing controls when an erase operation is required to reach the new value from the current value, and
    wherein the program-enabling means is responsive to the erase-enabling means, to the new value and to the current value for enabling the programming means when a program operation is required to reach the new value from the current value or when the erasing means has been enabled and the cell is programmed with the new value.

21. A flash memory device comprising:
    a matrix of memory cells;
    a block of non-volatile memory cells for storing protection information for the matrix of memory cells;
    a controller for simultaneously erasing a current value stored in the block of non-volatile memory cells;
    a data latch for receiving a new value to be written to at least one cell in the block of non-volatile memory cells;
    a program load bank coupled to the controller and the data latch for programming the cell in the block of non-volatile memory cells individually; and
    control logic couple to the controller and the data latch, the control logic for selecting at least one cell in the block of non-volatile memory cells for enabling the controller to erase the current value stored therein and for programming one or more of the non-volatile memory cells therein with the new value;
    whereby the control logic is governed by a result of a comparison between the new value to be written in the cell of the block of non-volatile memory cells with the current value stored in the cell of the block of non-volatile memory cells.

22. A method of updating a block of memory cells, the method comprising:
    storing a current value in a block of memory cells;
    receiving a new value to be written in the memory cells; and
    enabling an erasing the block of memory cells simultaneously and enabling a programming of the memory cells individually according to a comparison between a new value to be written and the current value.

* * * * *